(12) United States Patent
Asakawa (10) Patent No.: US 7,582,967 B2
(45) Date of Patent: Sep. 1, 2009

(54) SEMICONDUCTOR DEVICE, ELECTRONIC MODULE, AND METHOD OF MANUFACTURING ELECTRONIC MODULE

(75) Inventor: Tatsuhiko Asakawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 11/493,610

(22) Filed: Jul. 27, 2006

(65) Prior Publication Data

US 2007/0023903 A1    Feb. 1, 2007

(30) Foreign Application Priority Data

Aug. 1, 2005    (JP) .............................. 2005-222747

(51) Int. Cl.
*H01L 23/48* (2006.01)

(52) U.S. Cl. ....................... 257/737; 257/738

(58) Field of Classification Search ................ 257/737, 257/738, 778, 773, 786, 684, 688, 689, E21.503, 257/E21.504, E21.505; 438/106, 108, 125, 438/126, 127, 457

See application file for complete search history.

(56) References Cited

U.S. PATENT DOCUMENTS

| | | | | |
|---|---|---|---|---|
| 5,936,304 A | * | 8/1999 | Lii et al. | 257/701 |
| 6,175,157 B1 | * | 1/2001 | Morifuji | 257/777 |
| 7,091,619 B2 | | 8/2006 | Aoyagi | |
| 7,122,896 B2 | * | 10/2006 | Saito et al. | 257/738 |

FOREIGN PATENT DOCUMENTS

| | | |
|---|---|---|
| CN | 1532931 A | 9/2004 |
| JP | A 02-272737 | 11/1990 |
| JP | A 2004-253544 | 9/2004 |
| JP | A-2004-335660 | 11/2004 |
| JP | A-2005-136402 | 5/2005 |

\* cited by examiner

*Primary Examiner*—Steven Loke
*Assistant Examiner*—Kimberly M Thomas
(74) *Attorney, Agent, or Firm*—Oliff & Berridge, PLC (57) ABSTRACT

A semiconductor device including: a semiconductor chip having an electrode; a plurality of resin protrusions formed on a surface of the semiconductor chip on which the electrode is formed, heights of the resin protrusions increasing as a distance from a center of the surface of the semiconductor chip increases; and an interconnect electrically connected to the electrode and formed over one of the resin protrusions.

2 Claims, 6 Drawing Sheets

SEMICONDUCTOR DEVICE, ELECTRONIC MODULE, AND METHOD OF MANUFACTURING ELECTRONIC MODULE

Japanese Patent Application No. 2005-222747, filed on Aug. 1, 2005, is hereby incorporated by reference in its entirety.

BACKGROUND OF THE INVENTION

The present invention relates to a semiconductor device, an electronic module, and a method of manufacturing an electronic module.

An electronic module has been known in which a semiconductor device is mounted on an interconnect substrate (e.g. JP-A-2-272737). In order to manufacture a highly reliable electronic module, it is important to reliably electrically connect an interconnect pattern of the interconnect substrate with interconnects of the semiconductor device.

SUMMARY

According to a first aspect of the invention, there is provided a semiconductor device comprising:

a semiconductor chip having an electrode;

a plurality of resin protrusions formed on a surface of the semiconductor chip on which the electrode is formed, heights of the resin protrusions increasing as a distance from a center of the surface of the semiconductor chip increases; and an interconnect electrically connected to the electrode and formed over one of the resin protrusions.

According to a second aspect of the invention, there is provided an electronic module comprising:

a semiconductor device including a semiconductor chip having an electrode, a plurality of resin protrusions formed on a surface of the semiconductor chip on which the electrode is formed, and an interconnect electrically connected to the electrode and formed over one of the resin protrusions; and an interconnect substrate having an interconnect pattern, the semiconductor device being mounted on the interconnect substrate, wherein a portion of the interconnect disposed over one of the resin protrusions is in contact and electrically connected to an electrical connection section of the interconnect pattern;

wherein heights of the resin protrusions increases as a distance from a center of the surface of the semiconductor chip on which the electrode is formed increases; and wherein the interconnect substrate is warped so that a surface of the interconnect substrate on which the electrical connection section is formed is convex.

According to a third aspect of the invention, there is provided an electronic module comprising:

a semiconductor device including a semiconductor chip having an electrode, a plurality of resin protrusions formed on a surface of the semiconductor chip on which the electrode is formed, and an interconnect electrically connected to the electrode and formed over one of the resin protrusions; and an interconnect substrate having an interconnect pattern, the semiconductor device being mounted on the interconnect substrate, wherein a portion of the interconnect disposed over one of the resin protrusions is in contact and electrically connected to an electrical connection section of the interconnect pattern;

wherein heights of the resin protrusions increases as a distance from a center of the surface of the semiconductor chip on which the electrode is formed increases; and wherein the semiconductor chip is warped so that the surface on which the electrode is formed is convex.

According to a fourth aspect of the invention, there is provided a method of manufacturing an electronic module comprising:

providing a semiconductor device including a semiconductor chip having an electrode, a plurality of resin protrusions formed on a surface of the semiconductor chip on which the electrode is formed, and an interconnect electrically connected to the electrode and formed over one of the resin protrusions;

providing an interconnect substrate having an interconnect pattern and warped so that a surface of the interconnect substrate on which an electrical connection section of the interconnect pattern is formed is convex; and mounting the semiconductor device on the interconnect substrate so that a portion of the interconnect disposed over one of the resin protrusions is in contact and electrically connected to the electrical connection section, the resin protrusions being formed so that heights of the resin protrusions increases as a distance from a center of the surface of the semiconductor chip on which the electrode is formed increases.

According to a fifth aspect of the invention, there is provided a method of manufacturing an electronic module comprising:

providing a semiconductor device including a semiconductor chip having an electrode, a plurality of resin protrusions formed on a surface of the semiconductor chip on which the electrode is formed, and an interconnect electrically connected to the electrode and formed over one of the resin protrusions;

providing an interconnect substrate having an interconnect pattern; and mounting the semiconductor device on the interconnect substrate so that a portion of the interconnect disposed over one of the resin protrusions is in contact and electrically connected to the electrical connection section of the interconnect pattern, the semiconductor chip being warped so that the surface on which the electrode is formed is convex, and the resin protrusions being formed so that heights of the resin protrusions increases as a distance from a center of the surface of the semiconductor chip on which the electrode is formed increases.

According to a sixth aspect of the invention, there is provided a semiconductor device comprising:

a semiconductor chip having an electrode;

a first resin protrusion formed on a surface of the semiconductor chip on which the electrode is formed;

a second resin protrusion disposed on the surface of the semiconductor chip, the second resin protrusion having a greater distance from a center of the surface of the semiconductor chip than the first resin protrusion; and an interconnect electrically connected to the electrode and formed over at least one of the first and second resin protrusions, a height of the second resin protrusion being greater than a height of the first resin protrusion.

DETAILED DESCRIPTION OF THE EMBODIMENT

The invention may provide a semiconductor device exhibiting excellent mounting capability, an electronic module exhibiting high reliability, and a method of manufacturing an electronic module.

(1) According to one embodiment of the invention, there is provided a semiconductor device comprising:

a semiconductor chip having an electrode;

a plurality of resin protrusions formed on a surface of the semiconductor chip on which the electrode is formed, heights of the resin protrusions increasing as a distance from a center of the surface of the semiconductor chip increases; and an interconnect electrically connected to the electrode and formed over one of the resin protrusions.

This embodiment makes it possible to provide a semiconductor device exhibiting excellent mounting capability.

(2) In this semiconductor device, the semiconductor chip may be warped so that the surface of the semiconductor chip on which the electrode is formed is convex.

(3) According to one embodiment of the invention, there is provided an electronic module comprising:

a semiconductor device including a semiconductor chip having an electrode, a plurality of resin protrusions formed on a surface of the semiconductor chip on which the electrode is formed, and an interconnect electrically connected to the electrode and formed over one of the resin protrusions; and an interconnect substrate having an interconnect pattern, the semiconductor device being mounted on the interconnect substrate, wherein a portion of the interconnect disposed over one of the resin protrusions is in contact and electrically connected to an electrical connection section of the interconnect pattern;

wherein heights of the resin protrusions increases as a distance from a center of the surface of the semiconductor chip on which the electrode is formed increases; and wherein the interconnect substrate is warped so that a surface of the interconnect substrate on which the electrical connection section is formed is convex.

This embodiment makes it possible to provide an electronic module exhibiting high electrical connection reliability.

(4) In this electronic module, the semiconductor chip may be warped so that the surface of the semiconductor chip on which the electrode is formed is convex.

(5) According to one embodiment of the invention, there is provided an electronic module comprising:

a semiconductor device including a semiconductor chip having an electrode, a plurality of resin protrusions formed on a surface of the semiconductor chip on which the electrode is formed, and an interconnect electrically connected to the electrode and formed over one of the resin protrusions; and an interconnect substrate having an interconnect pattern, the semiconductor device being mounted on the interconnect substrate, wherein a portion of the interconnect disposed over one of the resin protrusions is in contact and electrically connected to an electrical connection section of the interconnect pattern;

wherein heights of the resin protrusions increases as a distance from a center of the surface of the semiconductor chip on which the electrode is formed increases; and wherein the semiconductor chip is warped so that the surface on which the electrode is formed is convex.

This embodiment makes it possible to provide an electronic module exhibiting high electrical connection reliability.

(6) According to one embodiment of the invention, there is provided a method of manufacturing an electronic module comprising:

providing a semiconductor device including a semiconductor chip having an electrode, a plurality of resin protrusions formed on a surface of the semiconductor chip on which the electrode is formed, and an interconnect electrically connected to the electrode and formed over one of the resin protrusions;

providing an interconnect substrate having an interconnect pattern and warped so that a surface of the interconnect substrate on which an electrical connection section of the interconnect pattern is formed is convex; and mounting the semiconductor device on the interconnect substrate so that a portion of the interconnect disposed over one of the resin protrusions is in contact and electrically connected to the electrical connection section, the resin protrusions being formed so that heights of the resin protrusions increases as a distance from a center of the surface of the semiconductor chip on which the electrode is formed increases.

This embodiment makes it possible to efficiently manufacture an electronic module exhibiting high reliability.

(7) In this method of manufacturing an electronic module, the semiconductor chip may be warped so that the surface of the semiconductor chip on which the electrode is formed is convex.

(8) According to one embodiment of the invention, there is provided a method of manufacturing an electronic module comprising:

providing a semiconductor device including a semiconductor chip having an electrode, a plurality of resin protrusions formed on a surface of the semiconductor chip on which the electrode is formed, and an interconnect electrically connected to the electrode and formed over one of the resin protrusions;

providing an interconnect substrate having an interconnect pattern; and mounting the semiconductor device on the interconnect substrate so that a portion of the interconnect disposed over one of the resin protrusions is in contact and electrically connected to the electrical connection section of the interconnect pattern, the semiconductor chip being warped so that the surface on which the electrode is formed is convex, and the resin protrusions being formed so that heights of the resin protrusions increases as a distance from a center of the surface of the semiconductor chip on which the electrode is formed increases.

This embodiment makes it possible to efficiently manufacture an electronic module exhibiting high reliability.

(9) According to one embodiment of the invention, there is provided a semiconductor device comprising:

a semiconductor chip having an electrode;

a first resin protrusion formed on a surface of the semiconductor chip on which the electrode is formed;

a second resin protrusion disposed on the surface of the semiconductor chip, the second resin protrusion having a greater distance from a center of the surface of the semiconductor chip than the first resin protrusion; and an interconnect electrically connected to the electrode and formed over at least one of the first and second resin protrusions, a height of the second resin protrusion being greater than a height of the first resin protrusion.

This embodiment makes it possible to provide a semiconductor device exhibiting excellent mounting capability.

Embodiments according to the invention will be described below with reference to the drawings. Note that the invention is not limited to the following embodiments. The invention also includes a configuration in which the following embodiments and modifications are arbitrarily combined.

Semiconductor device and method of manufacturing the same

Figure 1A:
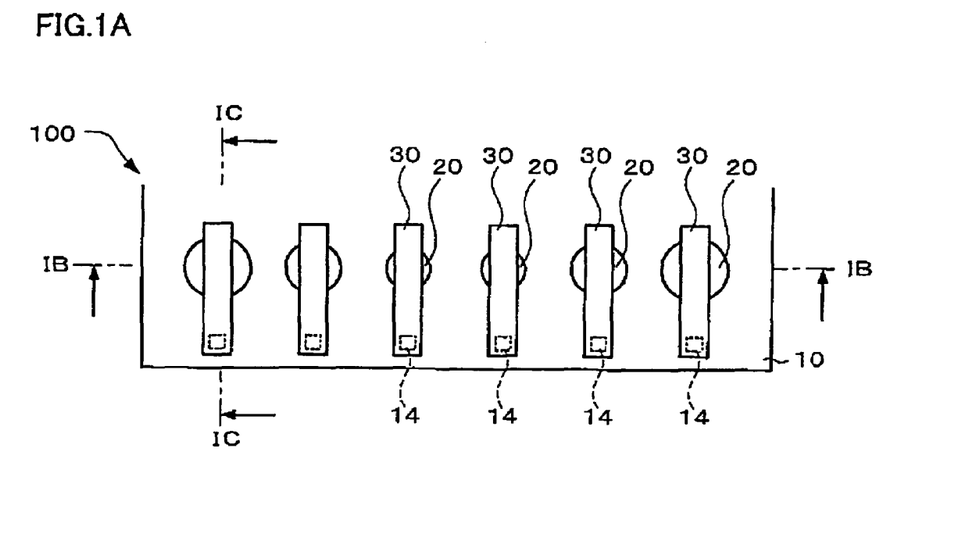
FIGS. 1A to 1C are views illustrative of a semiconductor device according to an embodiment to which the invention is applied.
Figure 1B:
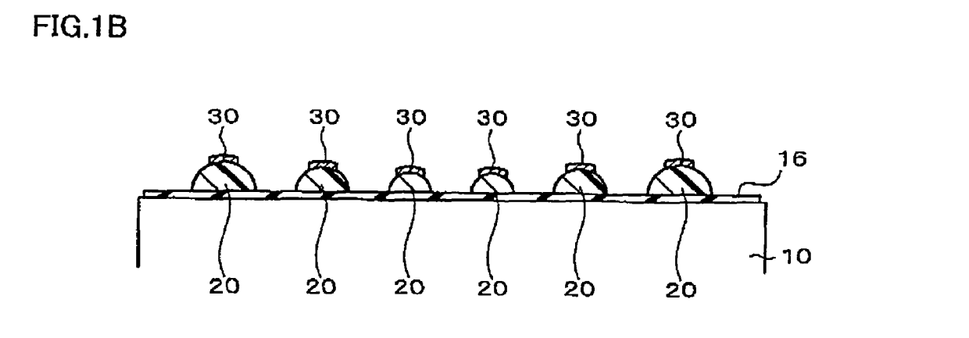
Figure 1C:
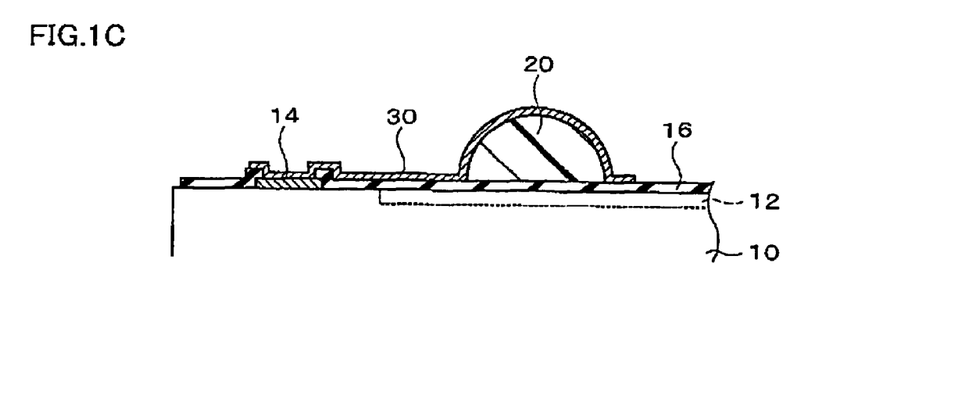

A semiconductor device according to an embodiment to which the invention is applied is described below with reference to the drawings. FIGS. 1A to 1C are views illustrative of a semiconductor device according to an embodiment to which the invention is applied. FIG 1A is a top view of a semiconductor device 100. FIG. 1B is a cross-sectional view along the line IB-IB in FIG. 1A, and FIG 1C is a cross-sectional view along the line IC-IC in FIG. 1A.

As shown in FIGS. 1A to 1C, the semiconductor device according to this embodiment includes a semiconductor chip 10. The semiconductor chip 10 may be a silicon substrate or the like. An integrated circuit 12 may be formed on the semiconductor chip 10 (see FIG. 1C). The configuration of the integrated circuit 12 is not particularly limited. For example, the integrated circuit 12 may include an active element such as a transistor and a passive element such as a resistor, coil, or capacitor. The surface (active surface) of the semiconductor chip 10 on which the integrated circuit 12 is formed may be rectangular. The active surface of the semiconductor chip 10 may be square (not shown).

As shown in FIGS. 1A and 1C, the semiconductor chip 10 is provided with electrodes 14. The electrode 14 may be electrically connected with the inside of the semiconductor chip 10. The electrode 14 may be electrically connected with the integrated circuit 12. A conductor which is not electrically connected with the integrated circuit 12 may also be referred to as the electrode 14. The electrode 14 may be part of an internal interconnect of the semiconductor chip. In this case, the electrode 14 may be part of the internal interconnect of the semiconductor chip used for electrical connection with the outside. The electrode 14 may be formed of a metal such as aluminum or copper. The electrodes 14 may be arranged along one side of the active surface of the semiconductor chip 10.

As shown in FIGS. 1B and 1C, the semiconductor chip 10 may be provided with a passivation film 16. The passivation film 16 may be formed to expose the electrode 14. The passivation film 16 may have an opening which exposes the electrode 14. The passivation film 16 may be formed to partially cover the electrode 14. In this case, the passivation film 16 may be formed to cover the edge of the electrode 14. The passivation film may be an inorganic insulating film formed of $SiO_2$, SiN, or the like. The passivation film 16 may be an organic insulating film formed of a polyimide resin or the like.

The surface of the semiconductor chip 10 on which the electrode 14 is formed may be flat. The semiconductor chip 10 may be warped so that the surface of the semiconductor chip 10 on which the electrode 14 is formed is convex (not shown). As shown in FIGS. 1A to 1C, the semiconductor device according to this embodiment includes a plurality of resin protrusions 20 formed on the semiconductor chip 10. The resin protrusion 20 is formed on the surface of the semiconductor chip 10 on which the electrode 14 is formed. The resin protrusion 20 may be formed on the passivation film 16. The material for the resin protrusion 20 is not particularly limited. A known material may be used as the material for the resin protrusion 20. For example, the resin protrusion 20 may be formed using a resin such as a polyimide resin, silicone-modified polyimide resin, epoxy resin, silicone-modified epoxy resin, benzocyclobutene (BCB), polybenzoxazole (PBO), or phenol resin.

The resin protrusions 20 are formed so that the resin protrusion 20 with a greater height is disposed at a greater distance from the center of the surface of the semiconductor chip 10 on which the electrode 14 is formed. Specifically, the resin protrusions 20 include a first resin protrusion, and a second resin protrusion which is disposed at a distance from the center of the surface of the semiconductor chip 10 on which the electrode 14 is formed greater than that of the first resin protrusion and has a height greater than that of the first resin protrusion. In this case, the resin protrusions 20 arranged along one side of the surface of the semiconductor chip 10 on which the electrode 14 is formed (the side may be a long side when the surface is rectangular) may be formed so that the resin protrusion 20 which is disposed closer to the end of the side has a greater height. The term "height of the resin protrusion 20" used herein may refer to the height of the portion of the resin protrusion 20 having the maximum height with respect to the surface of the semiconductor chip 10 on which the electrode 14 is formed. The shape of the resin protrusion 20 is not particularly limited. The resin protrusion 20 may be semicircular. In this case, the resin protrusion 20 may be circular in the top view (see FIG. 1A).

The resin protrusions 20 may be formed so that the resin protrusion 20 disposed at a greater distance from the center of the surface of the semiconductor chip 10 on which the electrode 14 is formed has a larger cross-sectional area of the lower portion. In other words, the resin protrusion 20 with a greater height may have a larger bottom surface (surface which faces the semiconductor chip 10).

As shown in FIGS. 1A to 1C, the semiconductor device according to this embodiment includes interconnects 30. The interconnect 30 is electrically connected with the electrode 14. The interconnect 30 is formed to extend over the electrode 14 and the resin protrusion 20. The interconnect 30 may be formed to extend over the top of the resin protrusion 20. In other words, the interconnect 30 may be formed over the resin protrusion 20. As shown in FIGS. 1A and 1B, one interconnect 30 may be formed to extend over one resin protrusion 20. In other words, only one interconnect 30 may be formed over one resin protrusion 20. In this case, the interconnect 30 may be formed to extend over the portion of the resin protrusion 20 having the maximum height. Note that a plurality of interconnects 30 may be formed over one resin protrusion 20 (not shown). The structure and the material for the interconnect 30 are not particularly limited. For example, the interconnect 30 may be formed of a single layer. Or, the interconnect 30 may be formed of a plurality of layers. In this case, the interconnect 30 may include a first layer formed of titanium tungsten and a second layer formed of gold (not shown).

The semiconductor device 100 may have the above-described configuration. According to the semiconductor device 100, a semiconductor device exhibiting excellent mounting capability can be provided. The effects of the semiconductor device 100 and mounting of the semiconductor device 100 are described later in detail in "Electronic module and method of manufacturing the same".

Figure 2:
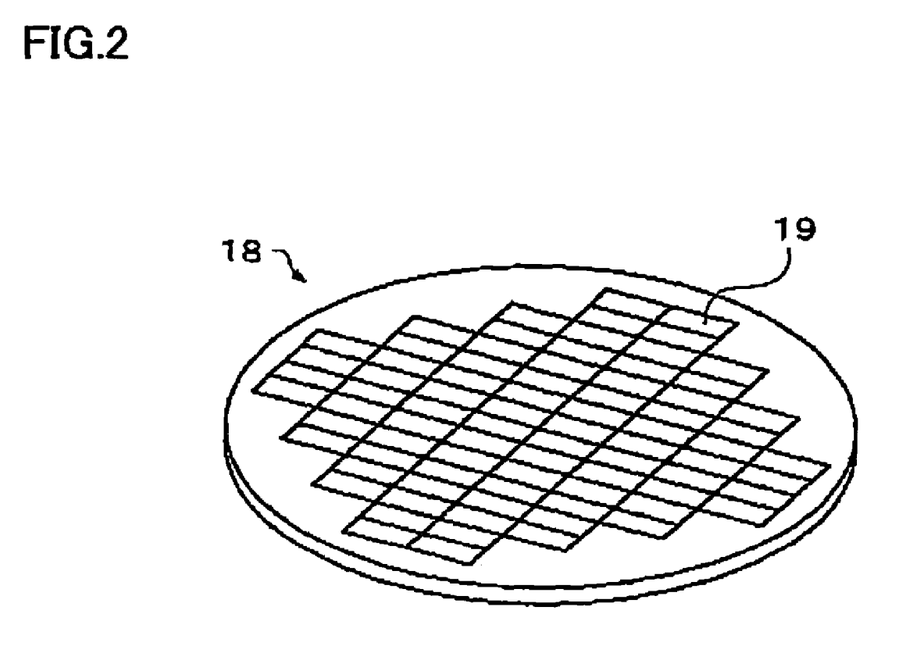
FIG. 2 is a view illustrative of a method of manufacturing a semiconductor device according to an embodiment to which the invention is applied.
Figure 3A:
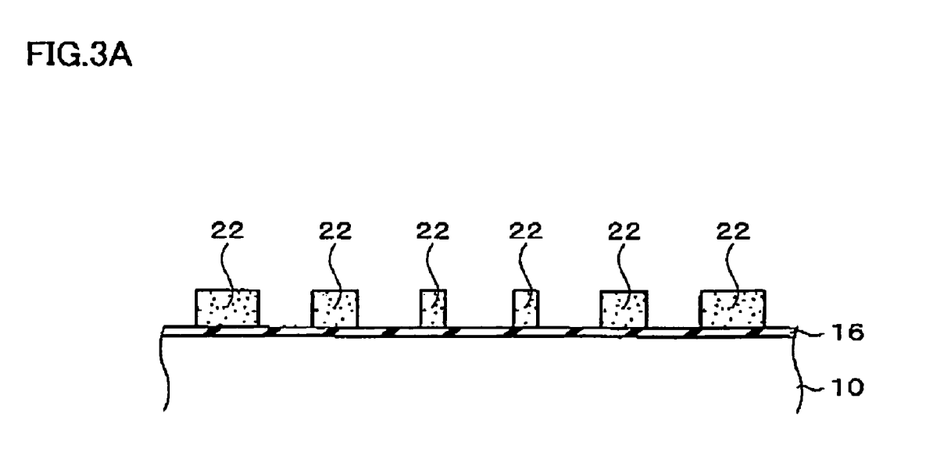
FIGS. 3A and 3B are views illustrative of a method of manufacturing a semiconductor device according to an embodiment to which the invention is applied.
Figure 3B:
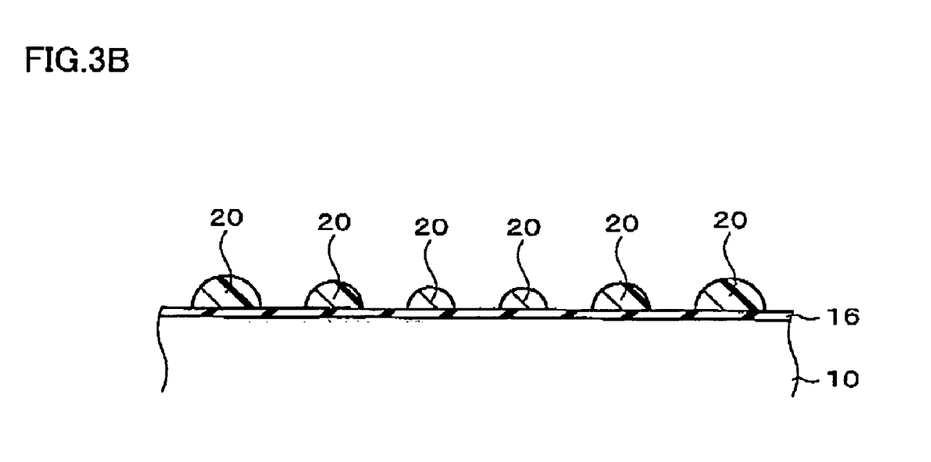

A method of manufacturing the semiconductor device 100 is described below. FIGS. 2 to 3B are illustrative of the method of manufacturing the semiconductor device 100.

The method of manufacturing the semiconductor device 100 may include providing a semiconductor substrate 18. As shown in FIG. 2, the semiconductor substrate 18 may be in the shape of a wafer. The semiconductor substrate 18 in the shape of a wafer may include regions 19 in which semiconductor devices (semiconductor chips 10) are respectively formed. Specifically, the semiconductor substrate 18 may have a structure in which a plurality of semiconductor chips are integrated. Note that a semiconductor substrate in the shape of a chip may also be utilized.

The method of manufacturing the semiconductor device includes forming a plurality of resin protrusions 20 on the semiconductor substrate 18. The resin protrusions 20 are formed so that a resin protrusion 20 with a greater height is disposed at a greater distance from the center of the surface of each region 19 on which the electrode 14 is formed. The formation method for the resin protrusion 20 is not particularly limited. For example, the resin protrusion 20 may be formed by providing a resin material 22 on the semiconductor substrate 18, and curing the resin material 22. In this case, the resin material 22 may be separately provided at a plurality of locations. The height (size) of the resin protrusion 20 may be controlled by adjusting the amount of resin material. Specifically, the height of the resin protrusion 20 may be controlled by changing the amount of resin material used. For example, as shown in FIG. 3A, the resin material may be provided so that the amount of resin used to form one resin protrusion 20 increases as the distance from the center of the region 19 increases. This allows a resin protrusion 20 disposed at a distance from the center of the region 19 to be formed to have a height greater than that of a resin protrusion 20 disposed closer to the center of the region 19, as shown in FIG. 3B. This may allow the resin protrusion 20 with a greater height to have a larger bottom surface. The resin material 22 may be provided to a uniform thickness (see FIG. 3A). When the resin material is provided to a uniform thickness, the height of the resin protrusion may be changed by melting and curing the resin material. The height of the resin protrusion may be changed by utilizing the cure shrinkage of the resin material. Note that the thickness of the resin material may be changed by adjusting the amount of resin material.

The method of manufacturing the semiconductor device includes forming the interconnect 30 electrically connected with the electrode 14. The interconnect 30 is formed to extend over the resin protrusion 20. The interconnect 30 may be formed using a known method.

The semiconductor substrate 18 may be divided in units of regions 19 by cutting the semiconductor substrate 18 to form the semiconductor device 100 (see FIGS. 1A to 1C).

Electronic Module and Method of Manufacturing the Same

A method of manufacturing an electronic module according to an embodiment to which the invention is applied is described below with reference to FIGS. 4A to 5. The method of manufacturing an electronic module according to this embodiment includes providing the semiconductor device 100. The semiconductor device 100 may have any of the above-described configurations.

Figure 4A:
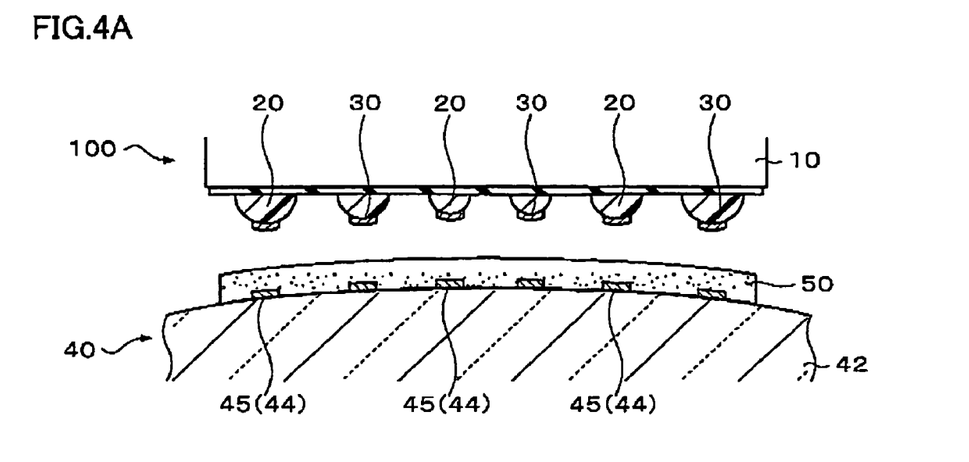
FIGS. 4A to 4C are views illustrative of a method of manufacturing an electronic module according to an embodiment to which the invention is applied.
Figure 4B:
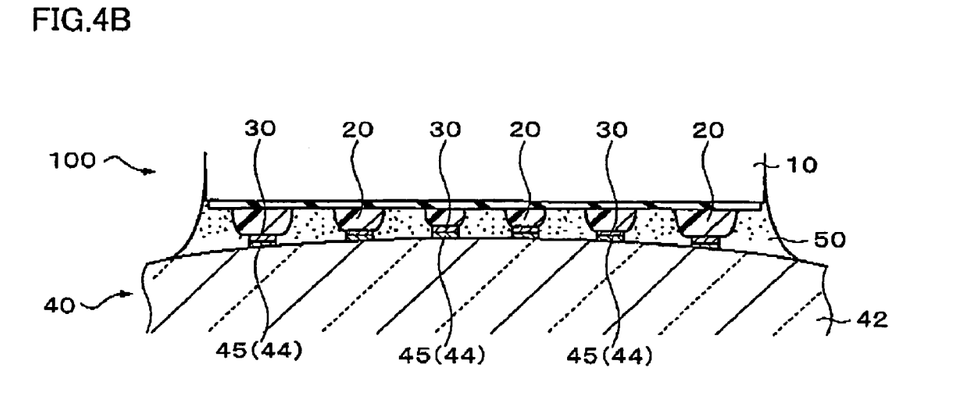
Figure 4C:
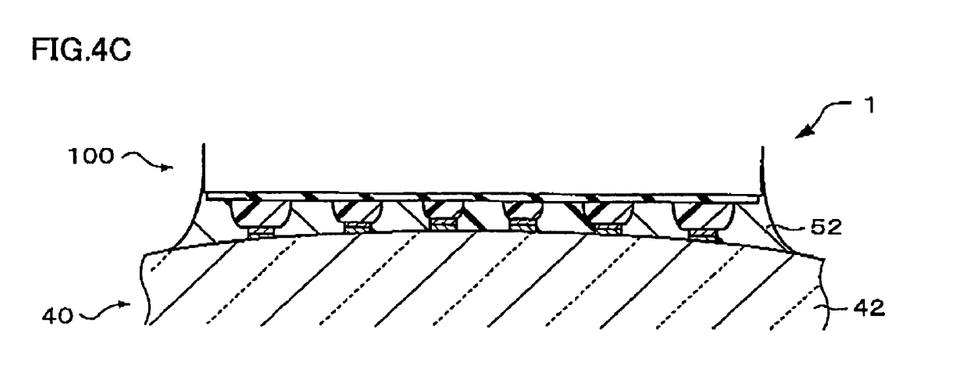

The method of manufacturing an electronic module according to this embodiment includes providing an interconnect substrate 40 (see FIG. 4A). The interconnect substrate 40 may include a base substrate 42 and an interconnect pattern 44. The interconnect pattern 44 includes an electrical connection section 45. The electrical connection section 45 is the part of the interconnect pattern 44 used for electrical connection with another member. The interconnect substrate 40 is warped so that the surface on which the electrical connection section 45 of the interconnect pattern 44 is formed is convex. In other words, the interconnect substrate 40 is warped so that the surface which faces the semiconductor device 100 (surface on which the semiconductor device 100 is mounted) is convex. The interconnect substrate 40 may be warped as described above when mounting the semiconductor device 100 on the interconnect substrate 40. When the base substrate 42 is a rigid substrate, the interconnect substrate 40 may be warped due to the warped base substrate 42. When the base substrate 42 is a flexible substrate, the interconnect substrate 40 may be warped using a support which supports the interconnect substrate 40 when mounting the semiconductor device 100 on the interconnect substrate 40.

The material for the base substrate 42 is not particularly limited. The material for the base substrate 42 may be an organic or inorganic material, or may be a composite structure of organic and inorganic materials. A substrate formed of an inorganic material may be used as the base substrate 42. In this case, the base substrate 42 may be a ceramic substrate or a glass substrate. When the base substrate 42 is a glass substrate, the interconnect substrate 40 may be part of an electro-optical panel (e.g. liquid crystal panel or electroluminescent panel). The interconnection pattern 42 may be formed of a metal film or a metal compound film such as indium tin oxide (ITO), Cr, or Al, or a composite of such films. The interconnection pattern 44 may be electrically connected with an electrode which drives a liquid crystal (e.g. scan electrode, signal electrode, or common electrode). The base substrate 42 may be a substrate or a film formed of polyethylene terephthalate (PET). Or, a flexible substrate formed of a polyimide resin may be used as the base substrate 42. A tape used for a flexible printed circuit (FPC) or tape automated bonding (TAB) technology may be used as the flexible substrate. In this case, the interconnect pattern 44 may be formed by stacking any of copper (Cu), chromium (Cr), titanium (Ti), nickel (Ni), and titanium tungsten (Ti—W), for example. The interconnect pattern 44 may be formed to partially extend inside the base substrate 42.

The method of manufacturing an electronic module according to this embodiment includes mounting the semiconductor device 100 on the interconnect substrate 40. This may cause the portion of the interconnect 30 disposed over the resin protrusion 20 to be in contact and electrically connected with the electrical connection section 45 of the interconnect pattern 44. The method of mounting the semiconductor device 100 on the interconnect substrate 40 is not particularly limited. An example of the method of mounting the semiconductor device 100 on the interconnect substrate 40 is described below with reference to FIGS. 4A to 4C. As shown in FIG. 4A, the semiconductor device 100 is disposed on the interconnect substrate 40 and positioned so that the interconnect 30 of the semiconductor device 100 faces the interconnect pattern 44 (electrical connection section 45) of the interconnect substrate 40. As shown in FIG. 4B, the semiconductor device 100 is pressed against the interconnect substrate 40 to allow the interconnect 30 to contact the interconnect pattern 44 (electrical connection section 45). The resin protrusion 20 may be crushed using the semiconductor chip 10 and the interconnect substrate 40 to elastically deform the resin protrusion 20. This allows the interconnect 30 to be pressed against the electrical connection section 45 (interconnect pattern 44) due to the elastic force of the resin protrusion 20, whereby an electronic module exhibiting high electrical connection reliability can be provided.

In this step, an adhesive 50 may be provided in advance between the semiconductor device 100 and the interconnect substrate 40. As shown in FIG. 4A, the adhesive 50 may be provided on the interconnect substrate 40. A film-shaped adhesive may be used as the adhesive 50, for example. The adhesive 50 may be an insulating adhesive. The adhesive 50 may be cured after mounting the semiconductor device 100 on the interconnect substrate 40 to form an adhesive layer 52. The interval between the semiconductor chip 10 and the interconnect substrate 40 may be maintained using the adhesive layer 52. Specifically, the elastically deformed state of the resin protrusion 20 may be maintained using the adhesive layer 52. For example, the elastically deformed state of the resin protrusion 20 may be maintained by curing the adhesive 50 in a state in which the resin protrusion 20 is crushed.

An electronic module 1 may be formed by the above steps after arbitrarily performing an inspection step and a cutting step.

In the semiconductor device 100, the resin protrusions 20 are formed so that the resin protrusion 20 with a greater height is disposed at a greater distance from the center of the surface of the semiconductor chip 10 on which the electrode 14 is formed, as described above. This configuration allows manufacture of a highly reliable electronic module even if the interconnect substrate 40 is warped so that the surface on which the electrical connection section 45 is formed is convex. The reasons therefor are described below in detail.

An interconnect substrate may be warped. For example, a nonuniform force may be applied to the interconnect substrate when transporting the interconnect substrate by means of vacuum adsorption or securing the interconnect substrate on a bonding stage by means of vacuum adsorption, whereby the interconnect substrate may be warped. The interconnect substrate may be heated. In this case, the interconnect substrate may be warped due to nonuniformity in composition between the upper and lower surfaces of the interconnect substrate. In particular, the interconnect substrate 40 on which the electrical connection section 45 is formed on one surface may be warped so that the surface on which the electrical connection section 45 is formed becomes convex. In this case, if the interconnect 30 can be caused to contact the electrical connection section 45, a highly reliable electronic module can be manufactured.

In the semiconductor device 100, the resin protrusions 20 are formed so that a resin protrusion 20 with a greater height is disposed at a greater distance from the center of the surface of the semiconductor chip 10 on which the electrode 14 is formed, as described above. This allows the surface formed by connecting the upper surfaces of the resin protrusions 20 to have a shape similar to that of the surface of the interconnect substrate 40 (surface on which the electrical connection section 45 is formed). Therefore, all the interconnects 30 and the electrical connection sections 45 can be caused to come into contact.

As a result, the method of manufacturing an electronic module according to this embodiment allows manufacture of a highly reliable electronic module even when using the interconnect substrate 40 which is warped so that the surface on which the electrical connection section 45 is formed is convex. This makes it unnecessary to handle the interconnect substrate 40 so that warping does not occur, whereby an electronic module can be efficiently manufactured. According to the semiconductor device 100, a semiconductor device exhibiting excellent mounting capability can be provided which can be mounted on a warped interconnect substrate.

When the semiconductor chip 10 of the semiconductor device 100 is warped so that the surface on which electrode 14 is formed is convex (see FIG. 6A), the surface formed by connecting the upper surfaces of the resin protrusions 20 can be caused to have a shape similar to that of the surface of the interconnect substrate 40 (surface on which the electrical connection section 45 is formed) by adjusting the height of the resin protrusion 20. Therefore, all the interconnects 30 and the electrical connection sections 45 can be caused to come into contact, whereby a highly reliable electronic module can be manufactured.

The electronic module 1 includes the semiconductor device 100. The electronic module 1 includes the interconnect substrate 40 having the interconnect pattern 44. The semiconductor device 100 is mounted on the interconnect substrate 40. The semiconductor device 100 is mounted on the interconnect substrate 40 so that the portion of the interconnect 30 disposed over the resin protrusion 20 contacts and is electrically connected with the electrical connection section 45 of the interconnect pattern 44. The interconnect substrate 40 is warped so that the surface on which the electrical connection section 45 is formed is convex.

According to the electronic module 1, an electronic module can be provided in which all the interconnects 30 are pressed against the electrical connection sections 45 at an appropriate load, even if the interconnect substrate 40 is warped. Specifically, the electronic module 1 allows provision of an electronic module exhibiting high electrical connection reliability.

Figure 5:
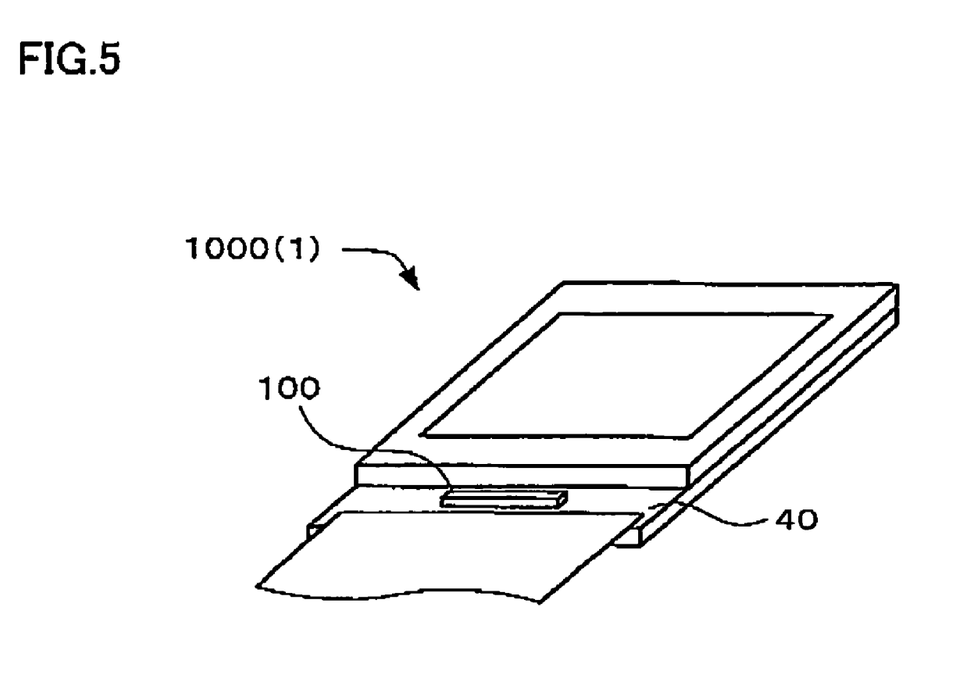
FIG. 5 is a view illustrative of an electronic module according to an embodiment to which the invention is applied.

FIG. 5 illustrates a display device 1000 as an example of the electronic module 1. The display device 1000 may be a liquid crystal display device, an electroluminescent (EL) display device, or the like. The semiconductor device 100 may be a driver IC which controls the display device 1000.

Modification

A modification of an embodiment to which the invention is applied is described below.

Figure 6A:
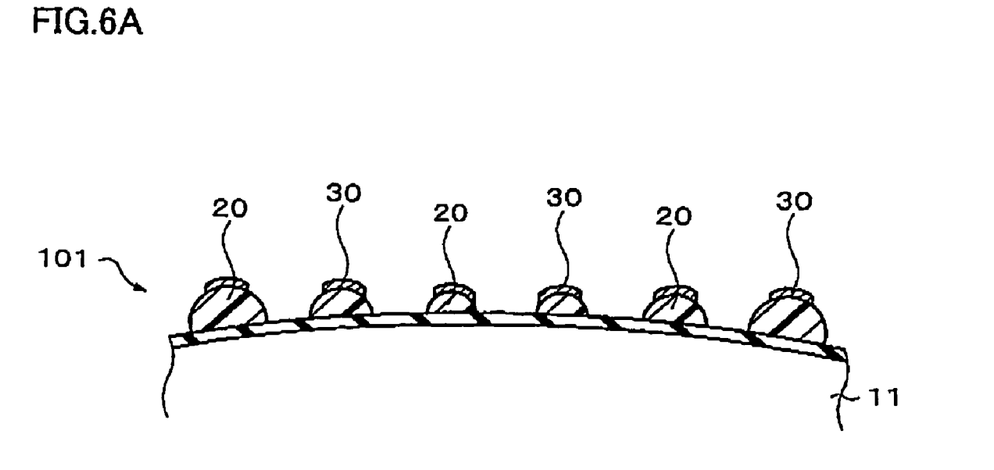
FIGS. 6A and 6B are views illustrative of a modification of an embodiment to which the invention is applied.
Figure 6B:
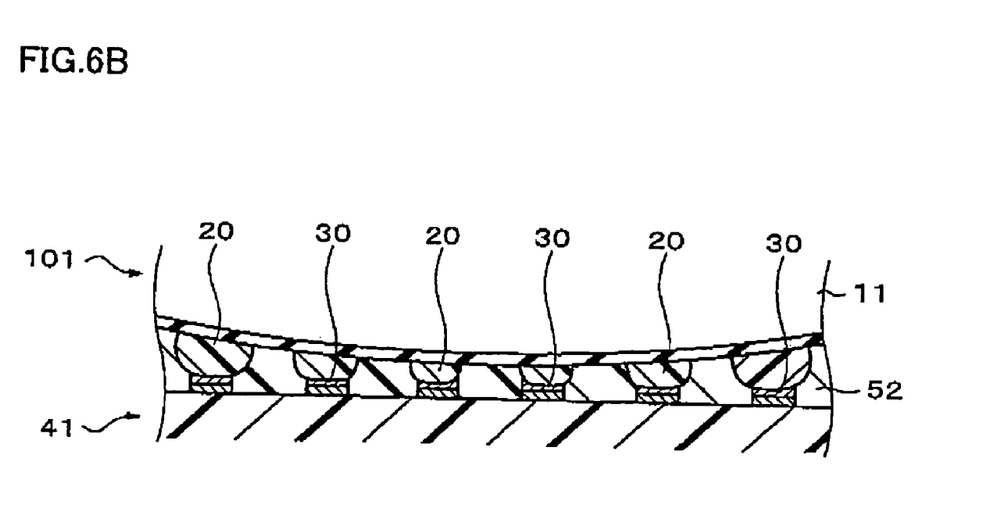

FIGS. 6A and 6B are views illustrative of a semiconductor device according to a modification of an embodiment to which the invention is applied. FIG. 6A is a top view of a semiconductor device 101. FIG. 6B is a view showing the state in which the semiconductor device 101 is mounted on a flat interconnect substrate 41.

The semiconductor device according to this embodiment includes a semiconductor chip 11. As shown in FIG. 6A, the semiconductor chip 11 is warped so that the surface on which the electrode 14 is formed is convex. Specifically, the semiconductor chip 11 may be warped so that the center of the surface on which the electrode 14 is formed has a height greater than that of the edge of the surface. In this case, the side of the surface of the semiconductor chip 11 on which the electrode 14 is formed may be curved so that the center portion protrudes from the end portion in the direction in which the surface on which the electrode 14 is formed faces outward. When the external shape of the surface of the semiconductor chip 11 on which the electrode 14 is formed is rectangular, the semiconductor chip 11 may be warped so that the centers of the two long sides protrude.

The semiconductor device according to this embodiment includes the resin protrusions 20. The resin protrusions 20 are formed so that the resin protrusion 20 with a greater height is disposed at a greater distance from the center of the surface of the semiconductor chip 11 on which the electrode 14 is formed. In this case, the resin protrusion 20 may be formed so that the top portions are disposed on one plane.

The semiconductor device according to this embodiment includes the interconnects 30. The interconnect 30 is electrically connected with the electrode 14. The interconnect 30 is formed to extend over the resin protrusion 20.

The semiconductor device 101 may have the above-described configuration. According to the semiconductor device 1 a semiconductor device exhibiting excellent mounting capability can be provided.

In general, a semiconductor chip may be warped. For example, warping may occur when the composition differs between the upper and lower surfaces of the semiconductor chip due to formation of the integrated circuit 12 and the passivation film on one surface of the semiconductor chip. In this case, if all the resin protrusions 20 have the same height, the top portions of the resin protrusions 20 are located at different positions. When the top portions of the resin protrusions 20 are located at different positions, it is difficult to mount the semiconductor device on the flat interconnect substrate 41.

In the semiconductor device 101, the resin protrusions 20 are formed so that the resin protrusion 20 with a greater height is disposed at a greater distance from the center of the surface of the semiconductor chip 11 on which the electrode 14 is formed. Therefore, when the semiconductor chip 11 is warped so that the surface on which the electrode 14 is formed is convex, the positions of the top portions of the resin protrusions 20 can be made uniform. Specifically, the surface formed by connecting the upper surfaces (interconnects 30) of the resin protrusions 20 can be made approximately flat, even if the semiconductor chip 11 is warped. Therefore, a semiconductor device exhibiting excellent mounting capability can be provided in which the warped semiconductor chip 11 can be mounted on the flat interconnect substrate 41, as shown in FIG. 6B.

When the resin protrusions 20 are formed so that the resin protrusions 20 are disposed on one virtual plane, since all the interconnects 30 can be pressed against the electrical connection sections of the flat interconnect substrate 41 at a uniform load, a semiconductor device exhibiting more excellent mounting capability can be provided.

The invention is not limited to the above embodiments. Various modifications and variations may be made. For example, the invention includes various other configurations substantially the same as the configurations described in the embodiments (such as a configuration having the same function, method, and results, or a configuration having the same objective and results). The invention also includes a configuration in which an unsubstantial portion in the embodiments is replaced. The invention also includes a configuration having the same effects as the configurations described in the embodiments, or a configuration capable of achieving the same objective as the configurations described in the embodiments. Further, the invention includes a configuration in which a known technique is added to the configurations described in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. An electronic module comprising:

a semiconductor chip;

an electrode that is formed on a first surface of the semiconductor chip;

a first resin protrusion that is formed on the first surface of the semiconductor chip, a first surface of the first resin protrusion facing the semiconductor chip;

a second resin protrusion that is formed on the first surface of the semiconductor chip, the second resin protrusion being farther from a center of the first surface of the semiconductor chip than the first resin protrusion, a height of the second resin protrusion being higher than a height of the first resin protrusion, a first surface of the second resin protrusion facing the semiconductor chip, an area of the first surface of the second resin protrusion being larger than an area of the first surface of the first resin protrusion;

an interconnect that is electrically connected to the electrode, a first portion of the interconnect being formed over one of the first resin protrusion or the second resin protrusion;

an interconnect substrate that is warped so that a first surface of the interconnect substrate is convex; and an interconnect pattern that is formed on the first surface of the interconnect substrate, a portion of the interconnect pattern being in contact with at least a part of the first portion of the interconnect.

2. An electronic module comprising:

a semiconductor device including a semiconductor chip having an electrode, a plurality of resin protrusions formed on a surface of the semiconductor chip on which the electrode is formed, first surfaces of the plurality of resin protrusions facing the surface of the semiconductor chip, and an interconnect electrically connected to the electrode and formed over one of the plurality of resin protrusions; and an interconnect substrate having an interconnect pattern, the semiconductor device being mounted on the interconnect substrate, wherein a portion of the interconnect disposed over one of the plurality of resin protrusions is in contact and electrically connected to an electrical connection section of the interconnect pattern;

wherein heights of the resin protrusions increase as a distance from a center of the surface of the semiconductor chip on which the electrode is formed increases, wherein areas of the first surfaces of the resin protrusions increase as a distance from the center of the surface of the semiconductor chip on which the electrode is formed increases; and wherein the interconnect substrate is warped so that a surface of the interconnect substrate on which the electrical connection section is formed is convex.

* * * * *